United States Patent [19]

Sharpe-Geisler

[11] Patent Number: 5,808,942
[45] Date of Patent: Sep. 15, 1998

[54] FIELD PROGRAMMABLE GATE ARRAY (FPGA) HAVING AN IMPROVED CONFIGURATION MEMORY AND LOOK UP TABLE

[75] Inventor: Bradley A. Sharpe-Geisler, San Jose, Calif.

[73] Assignee: Advanced Micro Devices, Inc., Sunnyvale, Calif.

[21] Appl. No.: 659,941

[22] Filed: Jun. 7, 1996

Related U.S. Application Data

[60] Provisional application No. 60/000,104, Jun. 9, 1995.
[51] Int. Cl.$^6$ ........................................ G11C 7/00
[52] U.S. Cl. ................ 365/189.08; 365/156; 326/38
[58] Field of Search ........................ 365/154, 156, 365/189.08, 189.05; 326/38, 40

[56] References Cited

U.S. PATENT DOCUMENTS

| | | | |
|---|---|---|---|
| 3,813,653 | 5/1974 | Smith et al. ........................ | 340/173 |
| 4,796,227 | 1/1989 | Lyon et al. ........................ | 365/154 |
| 4,872,141 | 10/1989 | Plus et al. ........................ | 365/154 |
| 5,148,390 | 9/1992 | Hsieh ........................ | 365/95 |

FOREIGN PATENT DOCUMENTS

0416546A2  9/1990  European Pat. Off. .

*Primary Examiner*—Joseph A. Popek
*Attorney, Agent, or Firm*—Fliesler, Dubb, Meyer & Lovejoy, LLP

[57] ABSTRACT

An FPGA including SRAM memory cells, each having a latch configured so that both read and write signals are provided through the data path connection. By providing both read and write through the data path, the FPGA further includes only a single decoder to control pass gates connected to the memory cells during read and write. To prevent voltages during write from damaging pass gates in the data path, the FPGA further includes a modified power supply to provide voltages ranging from $V_{DD}$ to $V_{SS}$ to the memory cell transistors during read, while providing a reduced voltage range during write to enable memory cell states to more easily be altered.

9 Claims, 4 Drawing Sheets

FIELD PROGRAMMABLE GATE ARRAY (FPGA) HAVING AN IMPROVED CONFIGURATION MEMORY AND LOOK UP TABLE

CROSS-REFERENCE TO RELATED APPLICATION

This application claims the benefit of U.S. Provisional application Ser. No. 60/000,104, filed Jun. 9, 1995.

BACKGROUND OF THE INVENTION

1. Field of the Invention

The present invention relates to the memory cell structure for a field programmable gate array (FPGA). More particularly, the present invention relates to reduction of components in the memory cell structure for an FPGA.

2. Description of the Related Art

FIG. 1 shows a block diagram illustrating components of a typical FPGA. The typical FPGA includes input/output blocks (IOBs), an array of configurable logic blocks (CLBs), resources for interconnection of the CLBs, and a configuration memory.

The IOBs are arranged around the perimeter of the device and provide an interface between internal components of the FPGA and external package pins.

Each of the CLBs in the array utilizes a subset of memory elements in the configuration memory as part of a look up table (LUT). The LUT further includes decoders (not shown) to address its memory cells. Input lines of a CLB, typically 4 or 5 lines, provide the address to the decoders. The LUT is programmed by storing values in its memory cells to implement Boolean functions. The memory cell of the LUT addressed provides a data bit on an output line of the CLB.

Resources for interconnection of the CLBs include interconnect lines, programmable interconnect points (PIPS) and switching matrixes. Inputs and outputs of a CLB are connectable to other CLBs, or to an IOB utilizing the interconnect lines. Programmable interconnect points (PIPs) and switching matrixes connect the interconnect lines to form specific paths between CLBs, or between a CLB and an IOB. PIPs, as well as switching matrixes, are programmed to make connections using memory cells in the configuration memory.

FIG. 2 shows a typical FPGA memory cell 200 along with connections of the memory cell 200 to pass gates 212 and 214 utilized to enable reading and writing. The memory cell 200 is a static random access memory (SRAM) including a latch formed by inverters 202 and 204. A data path for signals (DATAOUT) is provided to a first end of the latch through a data path connection 208. A programming, or write path for signals (DATAIN) is provided to a second end of the latch through a write path connection 210. A CMOS Buffer 206 is provided in the data path to drive a large capacitive load without affecting the contents stored by the cell as well as to prevent cross over. Cross over occurs when two cells with data paths connected together are turned on at the same time, a condition which might affect the contents stored by a cell.

To read a value from the memory cell 200, a read enable signal is applied to pass gate 212 provided in the data path. With the read enable signal high, data can be read from the latch 202, 204.

To write a value to the memory cell 200, a write enable signal is applied to a pass gate 214 provided in the write path. With the write enable signal high, data can be written to set or clear the latch 202, 204. With the write enable signal high, data can also be read from the write path to verify proper programming, as long as write is performed again to assure the verify operation does not disturb memory cell contents.

FIG. 3 shows alternative to the memory cell of FIG. 2. In FIG. 3, the inverters 202 and 204 of FIG. 2 are provided using CMOS devices, each including a PMOS pull up transistor and an NMOS pull down transistor connected as shown. The CMOS buffer 206 of FIG. 2 is provided by a transistor 302 in FIG. 3 with its gate connected to the output of inverter 202, its source connected to $V_{SS}$ and its drain connected to pass gate 212.

SUMMARY OF THE INVENTION

The present invention enables a reduction in the number of transistors utilized in an SRAM memory cell of an FPGA.

The present invention further enables a reduction in the number of decoders typically utilized to control reading and writing to memory cells in an FPGA. The present invention includes a memory cell with a latch configured so that both read and write signals are provided through the data path connection of the latch.

By providing both read an write signals through the data path, the number of transistors required per memory cell may be reduced. For instance, with write performed through the data path, pass gates utilizes in a separate write path, such as pass gate 214 of FIG. 2, are not required. Further, buffers provided between the data path connection and pass gates, such as buffer 206 of FIG. 2, must be removed Further, by providing both read and write through the data path, the number of decoders previously utilized is reduced. For instance, a decoder previously utilized for controlling pass gates in the write path, such as pass gate 214, is not required. Only a decoder utilized for controlling pass gates in the data path, such as pass gate 212, will be utilized.

To prevent crossover when buffers previously used to connect each memory cell to the data path are removed, several techniques are utilized by the present invention. First, transistors in the inverter of the memory cell latch driving the data path connection are made much larger than the transistors in the data path to prevent crossover and to prevent the driving of a capacitive load from disturbing latched data. Second, NOR gates used to drive transistors in the data path have PMOS and NMOS transistors appropriately sized to prevent crossover.

In order to write to a cell, the present invention further includes a modified power supply. The modified power supply provides voltages ranging from $V_{DD}$ to $V_{SS}$ to the memory cell latch transistors during read, while providing a reduced voltage range during write to enable memory cell states to more easily be altered.

BRIEF DESCRIPTION OF THE DRAWINGS

Further details of the present invention are explained with the help of the attached drawings in which:

FIGS. 5–1 and 5–2 shows a look up table of the present invention utilizing the memory cells of FIG. 4.

DETAILED DESCRIPTION

Figure 4:
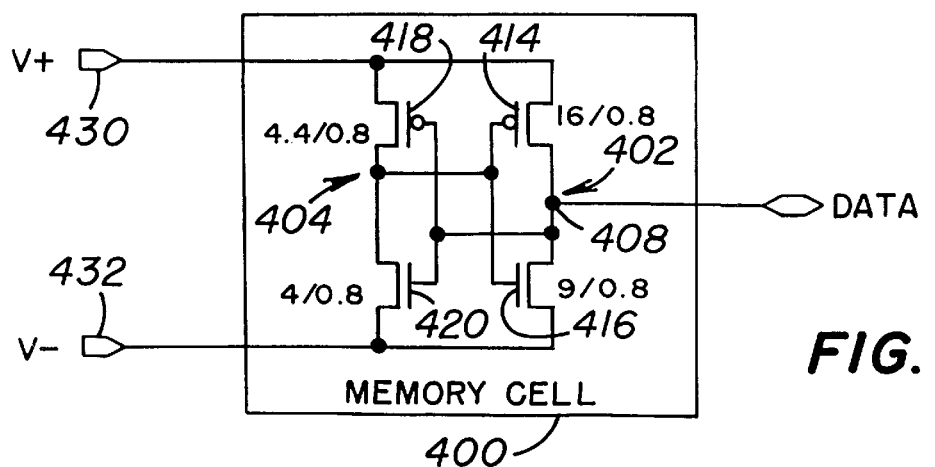
FIG. 4 shows a memory cell of the present invention.

FIG. 4 shows a memory cell 400 of the present invention. Like memory cell 200 of FIG. 2, memory cell 400 includes two inverters 402 and 404 forming a latch. Unlike the circuitry of FIG. 2, access to memory cell 400 for both writing and reading is available only through a data path connection 408.

Figure 2:
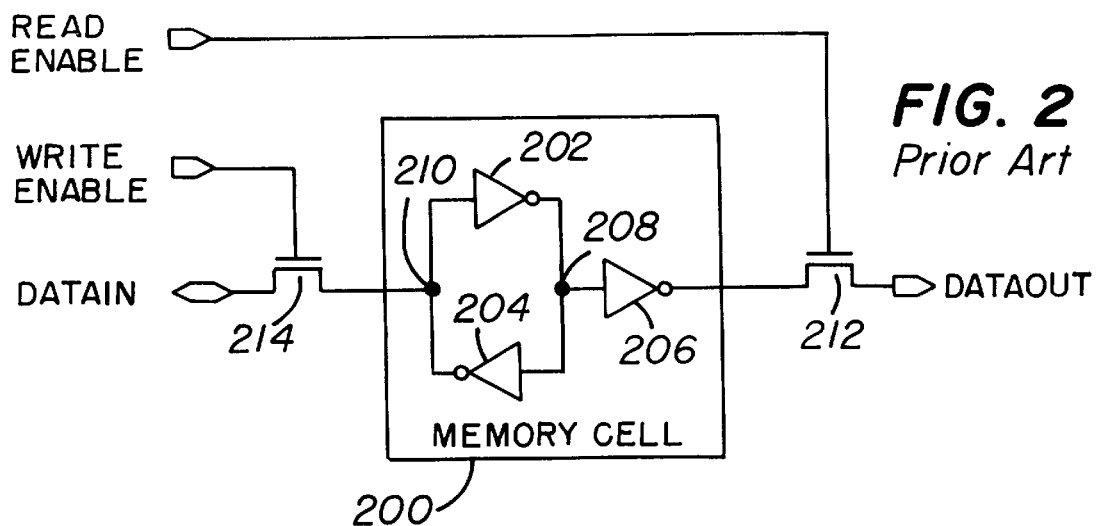
FIG. 2 shows a typical FPGA memory cell along with connections to pass gates utilized to enable reading and writing.
Figure 3:
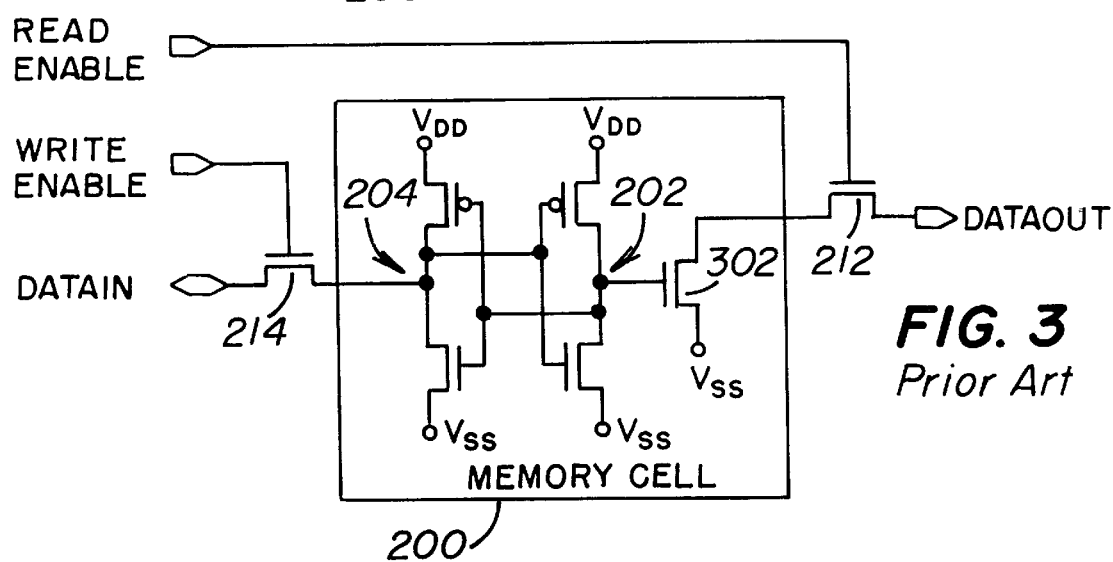
FIG. 3 shows an alternative to the memory cell of FIG. 2.

By providing write signals through the data path connection 408, no buffer, similar to buffer 206 of FIG. 2, can be used in the data path. Thus, the design of memory cell 400 of FIG. 4 reduces the transistor count of each memory cell from at least five in the design of FIG. 3 to four, significantly reducing overall circuitry for an FPGA.

Further, by providing write signals through the data path connection 408, pass gates, such as 214 of FIG. 2, previously used in a separate write path, are not required, further reducing overall circuitry for an FPGA.

In FIG. 4, the memory cell 400 includes an inverter 402 having a PMOS pull up transistor 414 and an NMOS pull down transistor 416. The PMOS pull up transistor 414 has a source connected to a first power supply node 430 (V+) and a drain connected to the data path connection 408. The NMOS pull down transistor 416 has a source connected to a second power supply node 432 (V-), a drain connected to the data path connection 408 and a gate connected to the gate of transistor 414.

Inverter 404 includes a PMOS pull up transistor 418 and an NMOS pull down transistor 420. The PMOS pull up transistor 418 has a source connected to the V+ power supply node 430 and a gate connected to the data path connection 408. The NMOS pull down transistor 420 has a source connected to the V- power supply node 432, a gate connected to the data path connection 408 and a drain connected to the drain of transistor 418 and to the gates of transistors 414 and 416.

With buffers previously used in the memory cell, such as 206, being removed, transistor sizes are adjusted to enable memory cell 400 to drive a large capacitive load, as well as to prevent cross over disturbance. The transistor sizes are adjusted so that the transistors of inverter 402 which drives the data path connection 408 are significantly larger than pass transistors provided in the data path. Suggested transistor sizes are shown for memory cell 400, with transistor channel width followed by channel length in microns placed next to each transistor. Transistor sizes are only suggested and may be changed to meet particular design requirements.

Figure 1:
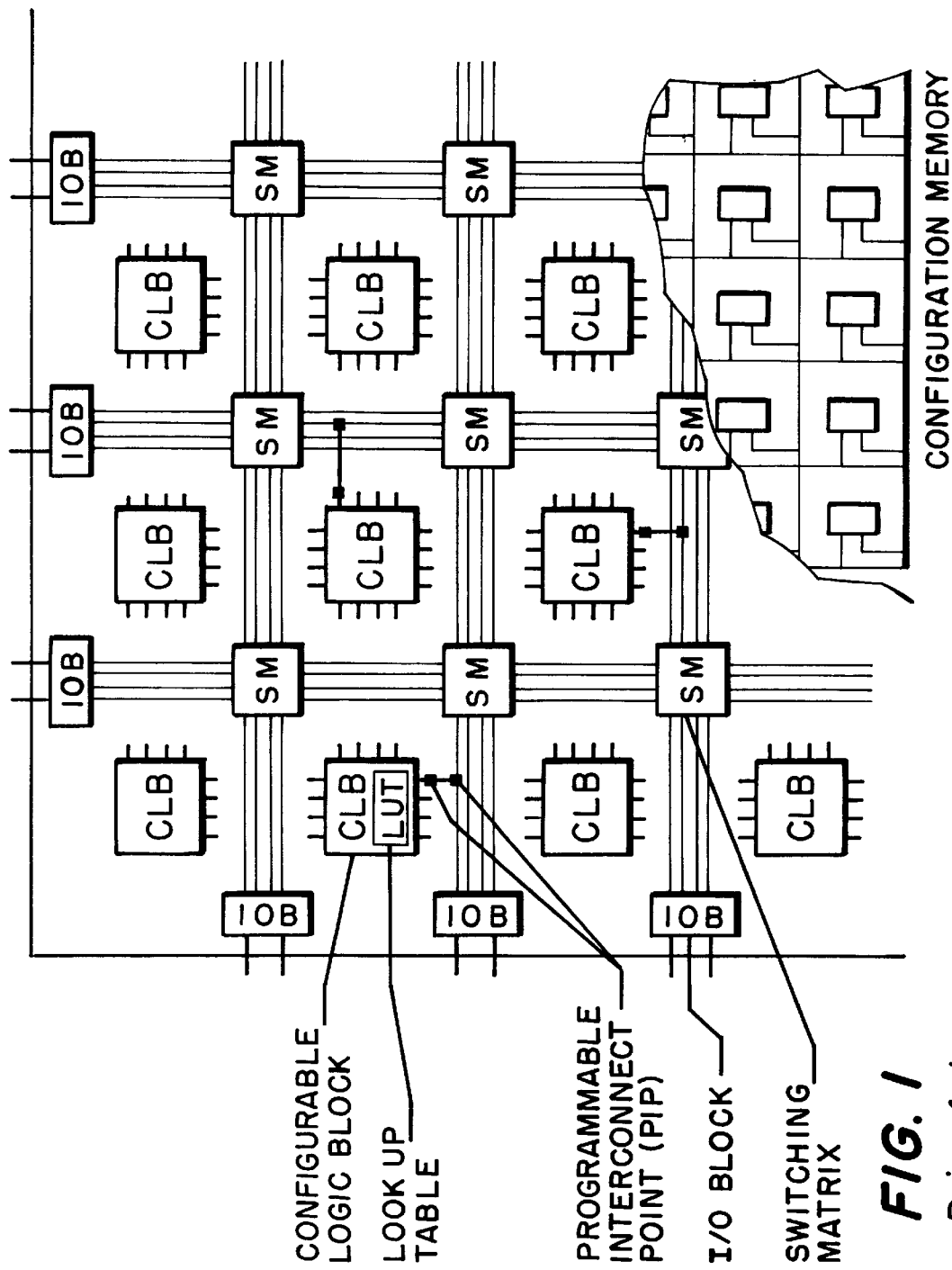
FIG. 1 shows a block diagram illustrating components of a typical FPGA.
Figures 1, 5:
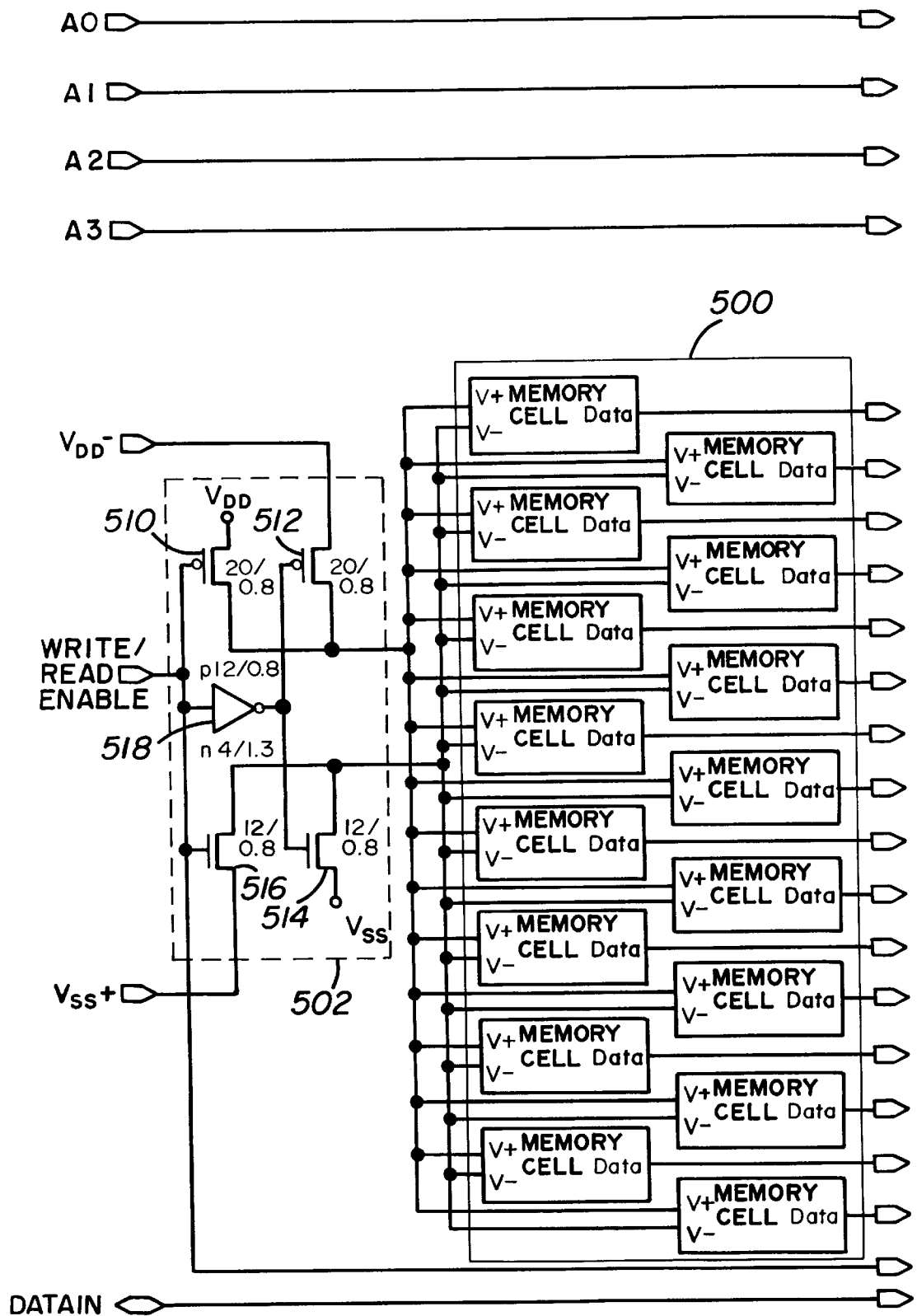
Figures 2, 5:
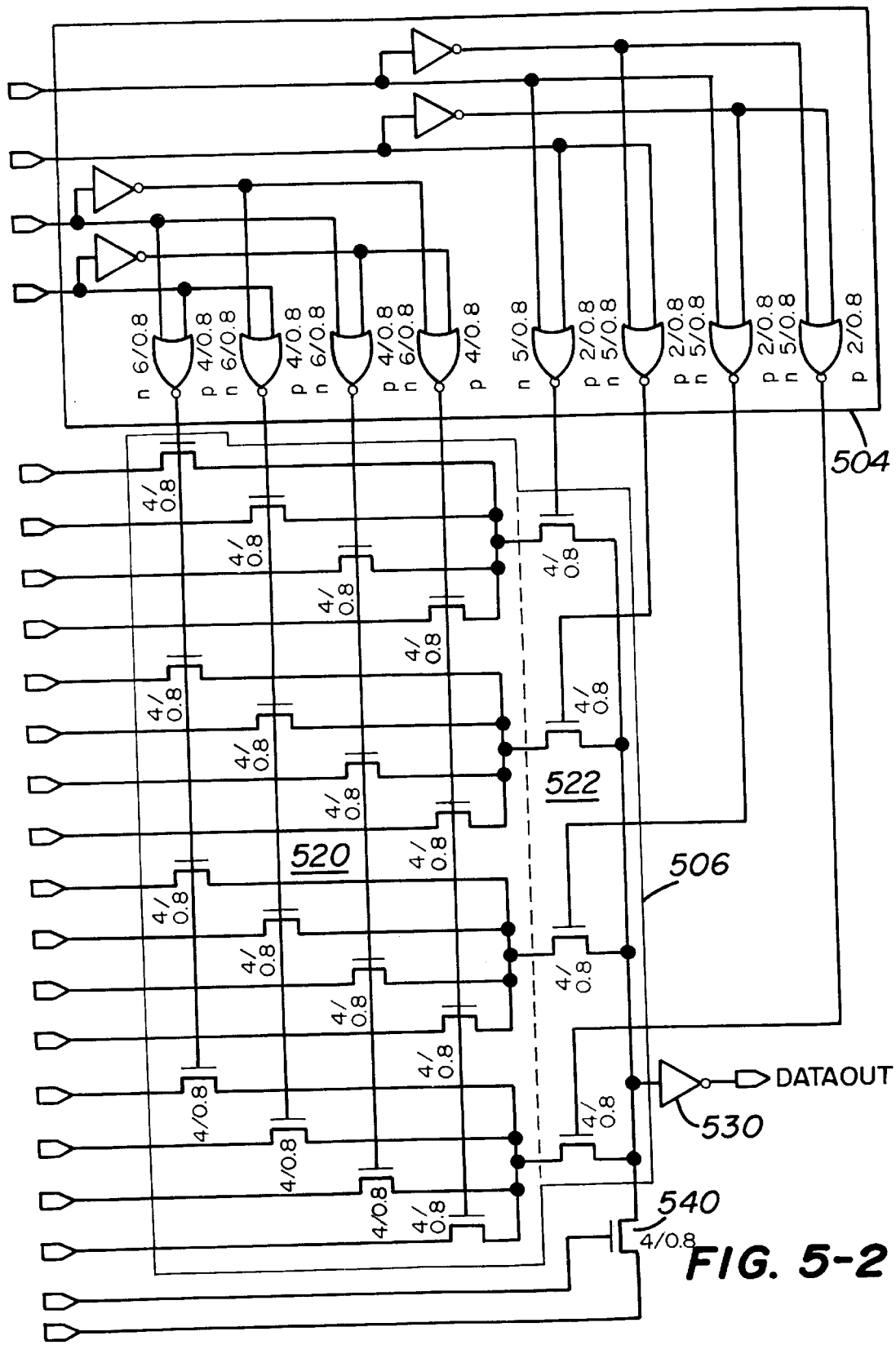

FIGS. 5–1 and 5–2 shows a look up table (LUT) of the present invention utilizing memory cells 500, each configured as shown in FIG. 4. The LUT further includes a modified power supply 502, decoder 504 and pass gates 506.

The modified power supply 502 is utilized in the present invention to prevent a large programming voltage necessary to overcome the inverter in each memory cell which drives the data path, such as 402 of FIG. 4, from adversely affecting the pass gates 506 provided in the data path. The modified power supply 502 is configured to reduce the supply voltage range provided to the V+ and V- power supply nodes of each memory cell during write and increase the supply voltage range to the V+ and V- nodes during read.

The modified power supply 502 includes first and second PMOS transistors 510 and 512, first and second NMOS transistors 514 and 516, and an inverter 518. The first PMOS transistor 510 has a source to drain path connecting a voltage $V_{DD}$ to the V+ nodes of the memory cells 500. The second PMOS transistor 512 has a source to drain path connecting a voltage $V_{DD}$-, which has a value less than $V_{DD}$, to the V+ nodes. With $V_{DD}$ being 5 V, a suggested value for $V_{DD}$- is 3.5 V, although other values may be used. The first NMOS transistor 514 has a source to drain path connecting $V_{SS}$ to the V- nodes of the memory cells 500. The second NMOS transistor 516 has a source to drain path connecting a voltage $V_{SS}$+, which has a value less than $V_{SS}$, to the V- nodes. With $V_{SS}$ being 0 V, a suggested value for $V_{SS}$+ is 1.5 V, although other values may be used. The gates of transistors 510 and 516 and the input of inverter 518 receive a write/read select signal which indicates a write mode when high, and a read mode when low. The gates of transistors 512 and 514 receive the output of inverter 518 which provides the inverse of the write/read select signal.

In operation, when the write/read select signal is low, indicating a read mode, transistor 510 turns on to provide $V_{DD}$ to the V+ node of memory cells 500, while transistor 514 turns on to provide $V_{SS}$ to the V- node of memory cells 500. During the read mode, transistors 512 and 516 remain off. When the write/read select signal is high, indicating a write mode, transistor 512 turns on to provide $V_{DD}$- to the V+ node of memory cells 500, while transistor 516 turns on to provide $V_{SS}$+ to the V+ node of memory cells 500. During the write mode, transistors 510 and 514 remain off.

Although the modified power supply 502 of the present invention pulls up $V_{SS}$ when $V_{DD}$ is reduced, an alternative configuration would only reduce $V_{DD}$. However, by reducing only $V_{DD}$, when $V_{DD}$ is later increased, the trip point, or thresholds of inverters of a selected memory cell, such as 402 and 404 of FIG. 4, change to possibly cause the value stored by the selected memory cell to be disturbed. By pulling up $V_{SS}$ when $V_{DD}$ is reduced, the trip point does not deviate.

The decoder 504 of FIG. 5–2 includes inverters and NOR gates, with the outputs of the NOR gates being connected to the gates of pass gates 506. The decoder 504 operates to decode address A0–A3 to control the gates of the pass gates 506 in the data path to enable only one of memory cells 500 at a time.

The pass gates 506 include a first set of pass gates 520 and a second set of pass gates 522. Pass gates in the first set of pass gates 520, each have a source to drain path connected on a first end to a respective one of memory cells 500. Pass gates in the second set of pass gates 522 have a source to drain paths connected together on a first end, and a second end connected to second ends of a respective group of pass gates 520. Each group of pass gates in pass gates 520 is defined by including no more than one pass gate connected to a single NOR gate. Note that as defined, the first pass gates 520 include four groups as shown, each group being connected to one of pass gates in the second set of pass gates 522.

Since no output buffer is provided in memory cells 500, the pass gates 506 are appropriately sized smaller than the size of transistors in the inverter of each memory cell connected to the data path to help prevent crossover disturbance during read operations.

Further, since no output buffer is provided in memory cells 500, the NOR gates of the decoder are appropriately sized to help prevent crossover disturbance. In the NOR gates, the PMOS transistors are made significantly smaller than corresponding NMOS transistors to eliminate crossover and minimize downstream capacitance. With the NOR gates so sized, no two pass transistors in a group of the first pass transistors 520 will be on at the same time. Further, no pass transistors in the second pass transistors 522 will be on at the same time. Since a group of pass gates in 520 includes no more than one pass gate connected to a NOR gate, two of memory cells 500 transitioning states will not be connected together to create cross over.

For purposes of size illustrations in FIGS. 5–1 and 5–2, the NOR gates are shown with suggested channel type and transistor dimensions for their p and n channel transistors, with a p or n indicating channel type followed by channel width and length in microns. Similarly, transistor sizes for inverter 518 are shown with a p or n indicating channel type followed by channel width and length in microns. Further in FIG. 5–2, transistor sizes for pass gates 506 are shown with a suggested channel width followed by channel length in microns. In FIGS. 5–1 and 5–2, transistor sizes and types are only suggested and may be changed to meet particular design requirements.

As shown by the circuitry of FIGS. 5–1 and 5–2, both read and write can be provided through the data path enabling the number of decoders previously utilized to be reduced. For instance, a decoder previously utilized for controlling pass gates in the write path, such as pass gate 214, is not required. Only the decoder 504 utilized for controlling pass gates in the data path is needed.

Further, in FIG. 5–2, the second ends of pass gates 506 are connected together to form the input of a buffer 530 which provides read data (DATAOUT) to subsequent circuitry. The buffer 530 is necessary to reduce the capacitance of subsequent circuitry.

To selectively provide the write voltages only when the modified power supply reduces the voltage range provided to memory cells 500, the second ends of pass gates 506 are also connected through a pass gate 540 which receives the write signal (DATAIN). The write/read select signal provided to the modified power supply 502 is then provided to the gate of a pass gate 520 to enable the write signal to only be provided when the write/read select signal is high, indicating a write mode.

Although the invention has been described above with particularity, this was merely to teach one of ordinary skill in the art how to make and use the invention. Many modifications will fall within the scope of the invention, as that scope is defined by the claims which follow.

What is claimed is:

1. A field programmable gate array (FPGA) comprising:
   memory cells, each one of the memory cells including a data path connection and a second connection, each one of the memory cells comprising:
   a first inverter comprising:
      a pull up transistor having a source to drain path connecting a first power supply connection to the data path connection, and a gate connected to the second connection; and
      a pull down transistor having a source to drain path connecting a second power supply connection to the data path connection, and a gate connected to the second connection; and
   a second inverter comprising:
      a pull up transistor having a source to drain path connecting the first power supply connection to the second connection, and a gate connected to the first connection; and
      a pull down transistor having a source to drain path connecting the second power supply connection to the second connection, and a gate connected to the second connection;
   a power supply receiving a write/read select signal, a $V_{DD}$ voltage potential, a $V_{SS}$ voltage potential, a $V_{DD}-$ voltage potential having a voltage value less than the $V_{DD}$ voltage potential, and a $V_{SS}+$ voltage potential having a voltage value greater than the $V_{SS}$ voltage potential, the power supply comprising:
      means for providing the $V_{DD}$ voltage potential to the first power supply connection when the write/read select signal indicates a read mode and for providing the $V_{DD}-$ voltage potential to the first power supply connection when the write/read select signal indicates a write mode; and
      means for providing the $V_{SS}$ voltage potential to the second power supply connection when the write/read select signal indicates a read mode and for providing the $V_{SS}+$ voltage potential to the second power supply connection when the write/read select signal indicates a write mode.

2. The FPGA of claim 4 wherein each one of the memory cells further comprising:
   a pass gate connected to the data path connection without buffering to enable the read and write signals to be selectively provided to the data path connection.

3. The FPGA of claim 1,
   wherein the means for providing the $V_{DD}$ voltage potential comprises:
      a first PMOS transistor having a source to drain path connecting the $V_{DD}$ voltage potential to the first power supply connection, and a gate connected to receive the write/read select signal; and
      a second PMOS transistor having a source to drain path connecting the $V_{DD}-$ voltage potential to the first power supply connection, and a gate connected to receive an inverse of the write/read select signal, and
   wherein the means for providing the $V_{SS}$ voltage potential comprises:
      a first NMOS transistor having a source to drain path connecting the $V_{SS}$ voltage potential to the second power supply connection, and a gate connected to receive the write/read select signal; and
      a second NMOS transistor having a source to drain path connecting the $V_{SS}+$ voltage potential to the second power supply connection, and a gate connected to receive an inverse of the write/read select signal.

4. A field programmable gate array (FPGA) comprising:
   memory cells, each including a memory cell latch having a data path connection and a second connection, each memory cell latch being connected so that both read and write signals are provided through the data path connection, each memory cell latch including:
   a first inverter having an output forming the data path connection; and
   a second inverter having an input connected to the output of the first inverter, wherein sizes of transistors in the first inverter are larger than corresponding transistors in the second inverter to prevent crossovers;
   pass gates, each pass gate having a source to drain path connecting the data path connection of at least one of the memory cells to a data path wherein read and write signals are selectively provided: and
   a decoder having outputs connected to at least one of the pass gates to selectively provide the read and write signals to the gates of the pass gates.

5. The FPGA of claim 4, wherein
the first inverter of each memory cell comprises:
- a pull up transistor having a source to drain path connecting a first power supply connection to the data path connection, and a gate connected to the second connection; and
- a pull down transistor having a source to drain path connecting a second power supply connection to the data path connection, and a gate connected to the second connection; and the second inverter of each memory cell comprises:
- a pull up transistor having a source to drain path connecting the first power supply connection to the second connection, and a gate connected to the first connection; and
- a pull down transistor having a source to drain path connecting the second power supply connection to the second connection, and a gate connected to the second connection.

6. The FPGA of claim 5, further comprising a power supply receiving a write/read select signal, a VDD voltage potential, a VSS voltage potential, a VDD− voltage potential having a voltage value less than the VDD voltage potential, and a VSS+ voltage potential having a voltage value greater than the VSS voltage potential, the power supply comprising:
- means for providing the VDD voltage potential to the first power supply connection when the write/read select signal indicates a read mode and for providing the VDD− voltage potential to the first power supply connection when the write/read select signal indicates a write mode; and
- means for providing the VSS voltage potential to the second power supply connection when the write/read select signal indicates a read mode and for providing the VSS+ voltage potential to the second power supply connection when the write/read select signal indicates a write mode.

7. The FPGA of claim 6,
wherein the means for providing the $V_{DD}$ voltage potential comprises:
- a first PMOS transistor having a source to drain path connecting the $V_{DD}$ voltage potential to the first power supply connection, and a gate connected to receive the write/read select signal; and
- a second PMOS transistor having a source to drain path connecting the $V_{DD}-$ voltage potential to the first power supply connection, and a gate connected to receive an inverse of the write/read select signal, and wherein the means for providing the $V_{SS}$ voltage potential comprises:
- a first NMOS transistor having a source to drain path connecting the $V_{SS}$ voltage potential to the second power supply connection, and a gate connected to receive the write/read select signal; and
- a second NMOS transistor having a source to drain path connecting the $V_{SS}+$ voltage potential to the second power supply connection, and a gate connected to receive an inverse of the write/read select signal.

8. The FPGA of claim 6, further comprising:
a write control pass gate having a source to drain path connecting the write signal to one or more of the pass gates, the write pass gate having a gate connected to receive the write/read select signal so that the write pass gate passes the write signal when the write/read select signal indicates a write mode.

9. A field programmable gate array (FPGA) comprising:
memory cells, each including a latch having a data path connection and a second connection, the latch being connected so that both read and write signals are provided through the data path connection;

pass gates, each pass gate having a source to drain oath connecting the data path connection of at least one of the memory cells to a data path wherein read and write signals are selectively provided; and a decoder having outputs connected to at least one of the pass gates to selectively provide the read and write signals to the gates of the pass gates wherein the pass gates comprise:
- first pass gates, each having a source to drain path connected on one end to a data path connection of a respective one of the memory cells; and
- second pass gates having source to drain paths connected together on a first end, each of the second pass gates having a second end of their source to drain path connected to a second end of source to drain paths of a respective group of the first pass gates, and wherein the decoder comprises:
- first NOR gates, each having an output connected to one pass gate in each respective group of the first pass gates; and
- second NOR gates, each having an output connected to a respective one of the second pass gates, wherein PMOS transistors in the first and second NOR gates have sizes smaller than corresponding NMOS transistors in the first and second NOR gates.

* * * * *